United States Patent
Wang et al.

(10) Patent No.: US 6,426,293 B1
(45) Date of Patent: Jul. 30, 2002

(54) MINIMIZING RESISTANCE AND ELECTROMIGRATION OF INTERCONNECT BY ADJUSTING ANNEAL TEMPERATURE AND AMOUNT OF SEED LAYER DOPANT

(75) Inventors: Pin-Chin C. Wang, Menlo Park; Sergey Lopatin, Santa Clara; Amit P. Marathe, Milpitas, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/872,717

(22) Filed: Jun. 1, 2001

(51) Int. Cl.⁷ .................... H01L 21/44; H01L 21/4763; H01L 21/66
(52) U.S. Cl. .................. 438/687; 438/17; 438/622; 438/639; 438/660; 438/678
(58) Field of Search ............... 438/687, 17, 622–624, 438/637–640, 660–663, 678, 672, 675

(56) References Cited

U.S. PATENT DOCUMENTS

| | | | |
|---|---|---|---|
| 6,181,012 B1 | 1/2001 | Edelstein et al. | 257/762 |
| 6,218,302 B1 * | 4/2001 | Braeckelmann et al. | |
| 6,228,759 B1 | 5/2001 | Wang et al. | 438/625 |
| 6,297,155 B1 * | 10/2001 | Simpson et al. | |
| 6,326,297 B1 * | 12/2001 | Vijayendran | |

OTHER PUBLICATIONS

Barrier and Seed Layers in Interconnect Circuits and a Method of Manufacture Therefor, U.S. Ser. No. 09/758,995 filed on Jan. 11, 2001.

Filling an Interconnect Opening with Different Types of Alloys to Enhance Interconnect Reliability, U.S. Ser. No. 09/655,700 filed on Sep. 6, 2000.

Binary Cu–Alloy Layers for Cu–Interconnections Reliability Improvement (Slides and Abstract), 2001 IEEE International Interconnect Technology Conference, San Francisco, California, Jun. 4, 2001.

* cited by examiner

*Primary Examiner*—Ha Tran Nguyen
(74) *Attorney, Agent, or Firm*—Monica H. Choi (57) ABSTRACT

A plurality of test interconnect structures are formed with each test interconnect structure having a respective alloy seed layer and with a fill conductive material formed to fill the respective interconnect opening. The respective alloy seed layer of each of the test interconnect structures has a respective thickness and a respective concentration of an alloy dopant within a bulk conductive material. A respective thermal anneal process is performed at a respective thermal anneal temperature for each of the plurality of test interconnect structures. A respective resistance and a respective rate of electromigration failure is measured for each of the plurality of test interconnect structures. For forming an IC interconnect structure within an IC interconnect opening, an alloy seed layer is deposited onto sidewalls and a bottom wall of the IC interconnect opening, and the IC interconnect opening is filled by growing a fill conductive material from the alloy seed layer within the IC interconnect opening. A thermal anneal process is performed at a thermal anneal temperature. A desired thickness of the alloy seed layer, a desired concentration of the alloy dopant, and a desired thermal anneal temperature for the IC interconnect structure are adjusted depending on the respective thickness of the alloy seed layer, the respective concentration of the alloy dopant, and the respective thermal anneal temperature of one of the plurality of test interconnect structures having the respective resistance that is closest to a desired resistance and/or having a respective measured rate of electromigration failure that is closest to a desired rate of electromigration failure for the IC interconnect structure.

28 Claims, 6 Drawing Sheets

| Alloy Seed Layer | Normalized Resistance with anneal at 250° Celsius | Normalized Resistance with anneal at 350° Celsius |
|---|---|---|
| Cu and 1.2 atomic % Zr | 1.205 | 1.067 |
| Cu and 1.0 atomic % In | 1.162 | 1.090 |

MINIMIZING RESISTANCE AND ELECTROMIGRATION OF INTERCONNECT BY ADJUSTING ANNEAL TEMPERATURE AND AMOUNT OF SEED LAYER DOPANT

TECHNICAL FIELD

The present invention relates generally to fabrication of interconnects within integrated circuits, and more particularly, to minimizing resistance and electromigration of an interconnect structure by adjusting the thermal anneal temperature and the amount of dopant of an alloy seed layer of the interconnect structure.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Figure 1:
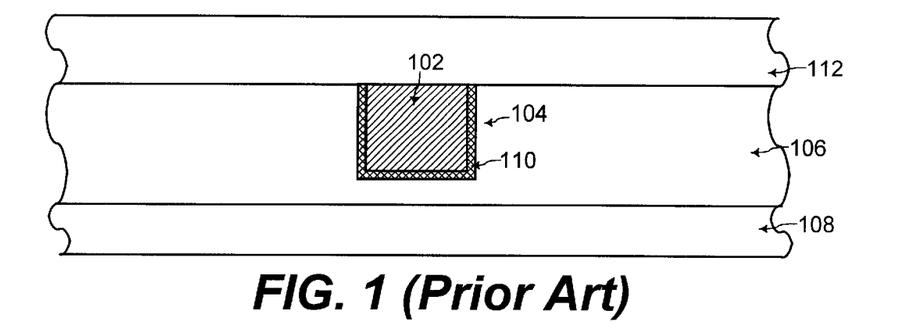
FIG. 1 shows a cross-sectional view of a copper interconnect formed by copper filling a trench within an insulating layer, according to the prior art.

Referring to FIG. 1, a cross sectional view is shown of a copper interconnect 102 within a trench 104 formed in an insulating layer 106. The copper interconnect 102 within the insulating layer 106 is formed on a semiconductor wafer 108 such as a silicon substrate as part of an integrated circuit. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. The low dielectric constant insulating material has a dielectric constant that is lower than that of pure silicon dioxide ($SiO_2$) for lower capacitance of the interconnect, as known to one of ordinary skill in the art of integrated circuit fabrication.

Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

Figure 2:
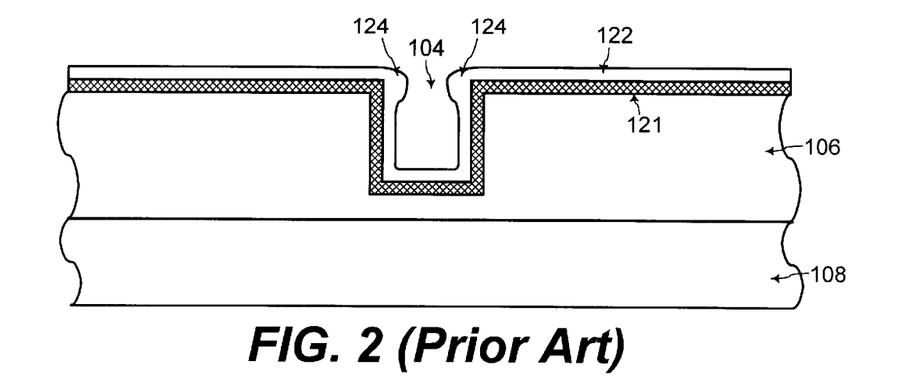
FIG. 2 shows a cross-sectional view of a seed layer of copper deposited on a diffusion barrier material at the sidewalls and the bottom wall of an interconnect opening for illustrating the formation of an overhang of the seed layer at the top corners of the interconnect opening when a relatively thick seed layer is deposited, according to the prior art.

Referring to FIG. 2, typically for filling the trench 104 with copper, a diffusion barrier material 121 is deposited on the sidewalls and the bottom wall of the trench 104. The diffusion barrier material 121 is similar to the diffusion barrier material 110 of FIG. 1. A seed layer 122 of copper is deposited on the diffusion barrier material 121 at the sidewalls and the bottom wall of the trench 104, and then copper is electroplated from the seed layer 122 to fill the trench 104 in an ECD (electrochemical deposition) process, as known to one of ordinary skill in the art of integrated circuit fabrication. The seed layer 122 of copper is typically deposited by a PVD (plasma-vapor-deposition) process as known to one of ordinary skill in the art of integrated circuit fabrication. With such a deposition process, referring to FIG. 2, when the aspect ratio (defined as the depth to the width) of the trench 104 to be filled with copper is relatively large (i.e., greater than 5:1), the seed layer 122 that is deposited on the sidewalls and the bottom wall of the opening 104 may have a significant overhang 124 at the top corners of the interconnect opening 104.

Figure 3:
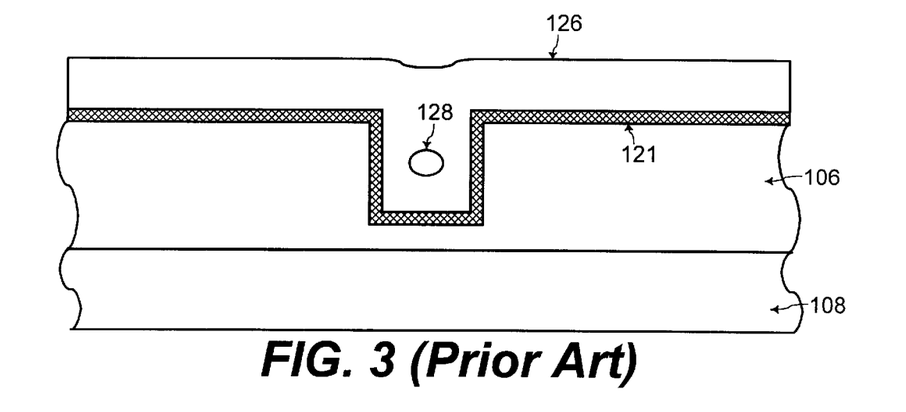
FIG. 3 shows a cross-sectional view of a copper fill plated from the seed layer of FIG. 2 for illustrating the formation of a void within the copper fill from the overhang of the seed layer of FIG. 2, according to the prior art.

Referring to FIGS. 2 and 3, when copper fill 126 is plated from the seed layer 122, the copper that is plated from the overhang 124 may close off the top of the interconnect opening 104 before a center portion of the interconnect opening 104 is filled with copper to result in formation of a void 128 within the copper fill 126 toward the center of the interconnect opening 104. Such a void 128 disadvantageously increases the resistance of the interconnect and may even contribute to electromigration failure of the interconnect.

Figure 4:
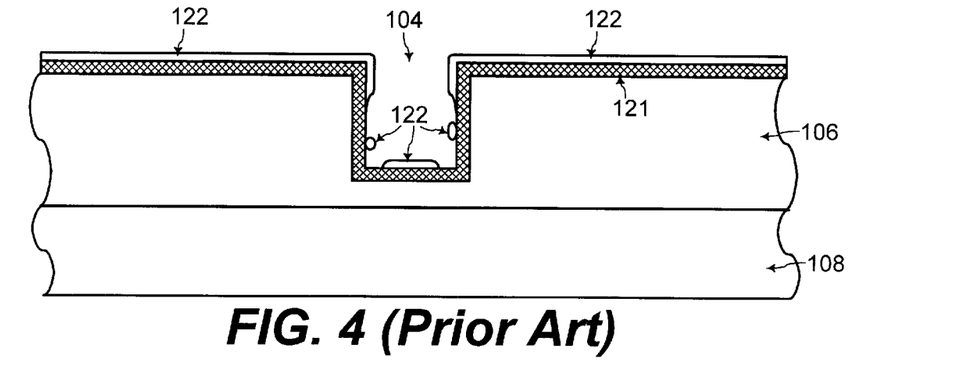
FIG. 4 shows a cross-sectional view of a relatively thin seed layer of copper deposited on the sidewalls and bottom wall of an interconnect opening for illustrating the discontinuity of the seed layer, according to the prior art.

Referring to FIG. 4, to minimize the overhang 124 at the top corners of the interconnect opening 104, the seed layer of copper 122 is deposited to be thinner. However, the deposition of the seed layer 122 is not perfectly conformal when the seed layer 122 is too thin (having a thickness of hundreds of angstroms). The seed layer 122 may be discontinuous and may not form at the sidewalls and the bottom comers of the interconnect opening 104. In addition, copper may agglomerate to form discontinuous granules when the seed layer 122 is too thin. However, it is desired for the copper fill to be plated from substantially all surfaces of the interconnect opening 104 including substantially the whole surface of the sidewalls and the bottom corners of the interconnect opening 104 to prevent void formation. Nevertheless, a thinner seed layer 122 is also desired to avoid formation of the overhang 124 for the interconnect opening 104 having high aspect ratio.

As described in U.S. Pat. No. 6,181,012 to Edelstein et al., a copper alloy instead of pure copper is used for the seed layer 122. The alloy seed layer having an alloy dopant such as aluminum, tin, indium, zirconium, or titanium for example has reduced mobility from pure copper such that electromigration is minimized. In addition, such an alloy seed layer tends to agglomerate less than pure copper such that the alloy seed layer may be thinner without agglomeration than a pure copper seed layer.

Despite such advantages of using an alloy seed layer instead of a pure copper seed layer, an alloy seed layer may increase the resistance of the interconnect structure. In the prior art, such effect of increase of resistance from the alloy seed layer is deemed to be negligible. For example, column 8, lines 5–21 of U.S. Pat. No. 6,181,012 to Edelstein et al. states:

> The present invention novel seed layer for depositing a copper conductor body can be formed of a copper alloy or other metals that does not contain copper . . . For instance, the seed layer may be an alloy with a higher electrical resistivity than the main conductor copper. Furthermore, the seed layer alloy may not even contain copper. As long as the cross-sectional area occupied by the seed layer is a small fraction of the entire conductor cross-sectional area, the overall line resistance will be determined by the resistivity of the main conductor and thus, not increased undesirably by the seed layer.

Thus, in the prior art, the effect of the alloy seed layer increasing the resistance of the interconnect structure is ignored because the volume of the alloy seed layer is assumed to be a negligible fraction of the entire interconnect structure. However, as integrated circuit dimensions are further scaled down to submicron dimensions, such an assumption may no longer be valid.

SUMMARY OF THE INVENTION

Accordingly, in a general aspect of the present invention, test interconnect structures are formed with a respective alloy seed layer with adjustment of parameters of the alloy seed layer and the thermal anneal process to minimize resistance and electromigration failure of an IC (integrated circuit) interconnect structure.

In a general aspect of the present invention, an IC (integrated circuit) interconnect structure is formed by filling an IC (integrated circuit) interconnect opening within an insulating layer on a semiconductor wafer. A plurality of test interconnect structures are formed with each test interconnect structure having a respective alloy seed layer deposited onto sidewalls and a bottom wall of a respective interconnect opening within an insulating layer and with a fill conductive material formed to fill the respective interconnect opening. The respective alloy seed layer of each of the test interconnect structures has a respective thickness and a respective concentration of an alloy dopant within a bulk conductive material. A respective thermal anneal process is performed at a respective thermal anneal temperature for each of the plurality of test interconnect structures. A respective resistance is measured for each of the plurality of test interconnect structures. In addition, a respective rate of electromigration failure is measured for each of the plurality of test interconnect structures.

For forming the IC interconnect structure, an alloy seed layer is deposited onto sidewalls and a bottom wall of the IC interconnect opening. The alloy seed layer within the IC interconnect opening is comprised of the bulk conductive material doped with the alloy dopant. The IC interconnect opening is filled with the fill conductive material by growing the fill conductive material from the alloy seed layer within the IC interconnect opening. A thermal anneal process is performed at a thermal anneal temperature to anneal the alloy seed layer and the fill conductive material within the IC interconnect opening.

According to one embodiment of the present invention, at least one of the thickness of the alloy seed layer, the concentration of the alloy dopant of the alloy seed layer, and the thermal anneal temperature are adjusted to a desired thickness of the alloy seed layer, a desired concentration of the alloy dopant, and a desired thermal anneal temperature to attain a desired resistance for the IC interconnect structure formed within the IC interconnect opening. The desired thickness of the alloy seed layer, the desired concentration of the alloy dopant, and the desired thermal anneal temperature for the IC interconnect structure are adjusted depending on the respective thickness of the alloy seed layer, the respective concentration of the alloy dopant, and the respective thermal anneal temperature of one of the plurality of test interconnect structures having the respective resistance that is closest to the desired resistance for the IC interconnect structure.

For example, the resistance of the IC interconnect structure is minimized when the desired thickness of the alloy seed layer, the desired concentration of the alloy dopant, and the desired thermal anneal temperature are adjusted depending on the respective thickness of the alloy seed layer, the respective concentration of the alloy dopant, and the respective thermal anneal temperature of one of the plurality of test interconnect structures having a respective resistance that is the lowest of measured respective resistances of the plurality of test interconnect structures.

In another embodiment of the present invention, at least one of the thickness of the alloy seed layer, the concentration of the alloy dopant of the alloy seed layer, and the thermal anneal temperature are adjusted to a desired thickness of the alloy seed layer, a desired concentration of the alloy dopant, and a desired thermal anneal temperature to attain a desired electromigration failure rate for the IC interconnect structure formed within the IC interconnect opening. The desired thickness of the alloy seed layer, the desired concentration of the alloy dopant, and the desired thermal anneal temperature for the IC interconnect structure are adjusted depending on the respective thickness of the alloy seed layer, the respective concentration of the alloy dopant, and the respective thermal anneal temperature of one of the plurality of test interconnect structures having the respective measured electromigration failure rate that is closest to the desired electromigration failure rate for the IC interconnect structure.

For example, the electromigration failure rate of the IC interconnect structure is minimized when the desired thickness of the alloy seed layer, the desired concentration of the alloy dopant, and the desired thermal anneal temperature are adjusted depending on the respective thickness of the alloy seed layer, the respective concentration of the alloy dopant, and the respective thermal anneal temperature of one of the plurality of test interconnect structures having a respective electromigration failure rate that is the lowest of measured respective electromigration failure rates of the plurality of test interconnect structures.

In a further embodiment of the present invention, at least one of the thickness of the alloy seed layer, the concentration of the alloy dopant of the alloy seed layer, and the thermal anneal temperature are adjusted to a desired thickness of the alloy seed layer, a desired concentration of the alloy dopant, and a desired thermal anneal temperature to attain a desired resistance and a desired electromigration failure rate for the IC interconnect structure formed within the IC interconnect opening. The desired thickness of the alloy seed layer, the desired concentration of the alloy dopant, and the desired thermal anneal temperature are adjusted depending on the respective thickness of the alloy seed layer, the respective concentration of the alloy dopant, and the respective thermal anneal temperature of one of the plurality of test interconnect structures having the respective measured resistance and the respective measured electromigration failure rate that are closest to the desired resistance and the desired electromigration failure rate for the IC interconnect structure.

For example, the present invention is used to particular advantage when such test interconnect structures indicate that with the fill conductive material being comprised of copper, the bulk conductive material of the alloy seed layer being comprised of copper, and the alloy dopant being comprised of tin (Sn) and having a concentration of about 0.3 atomic percent, the desired thickness of the alloy seed layer is about 500 angstroms, and the desired thermal anneal temperature is about 350° Celsius. An IC interconnect structure formed with such parameters of the seed layer and such a thermal anneal temperature has a electromigration failure rate that is reduced by about a factor of 2 from an IC interconnect structure formed with a pure copper seed layer. In addition, such an IC interconnect structure has a resistance that is even lower than an IC interconnect structure formed with a pure copper seed layer.

In this manner, instead of ignoring the effect of the alloy seed layer on the resistance of the interconnect structure as in the prior art, test interconnect structures are formed to minimize the resistance and the rate of electromigration failure of the IC interconnect structure. The present invention is especially advantageous as integrated circuit dimensions are further scaled down because the volume of the alloy seed layer may no longer be a negligible fraction of the entire interconnect structure.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION

The present invention is described for formation of copper interconnect. However, the present invention may be practiced for minimizing resistance and electromigration failure for conductive fill of other types of interconnects, as would be apparent to one of ordinary skill in the art of integrated circuit fabrication from the description herein. In addition, formation of a metal line within a trench opening is illustrated. However, the present invention may be practiced for filling other types of interconnect openings such as openings for a via hole or a dual damascene interconnect structure, as would be apparent to one of ordinary skill in the art of integrated circuit fabrication from the description herein.

In contrast to the prior art, the effect of the alloy seed layer on the resistance and the electromigration failure rate for the IC (integrated circuit) interconnect structure is not ignored. Rather, a plurality of test interconnect structures are formed before formation of the IC interconnect structure to assess the effect of the parameters of the alloy seed layer and the thermal anneal temperature on the resistance and the electromigration failure rate of the interconnect structure.

Figure 5:
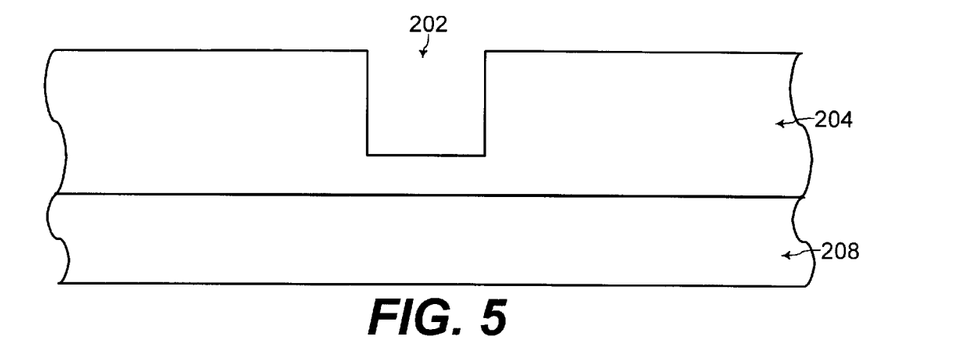
FIG. 5 shows a cross-sectional view of an interconnect opening formed in an insulating layer for formation of one of a plurality of test interconnect structures or an IC (integrated circuit) interconnect structure, according to an embodiment of the present invention.
Figure 6:
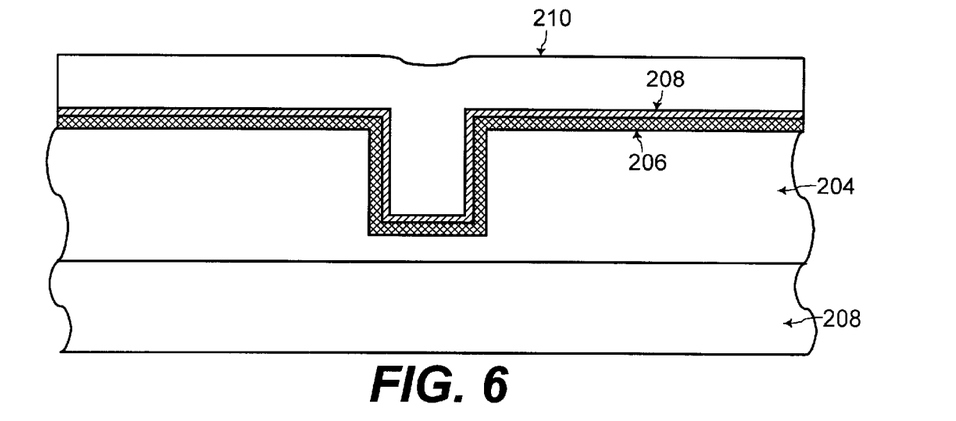
FIG. 6 shows a cross-sectional view of the interconnect opening of FIG. 5 filled with a diffusion barrier material, an alloy seed layer, and a fill conductive material, for a test interconnect structure or an IC interconnect structure, according to an embodiment of the present invention.
Figure 7:
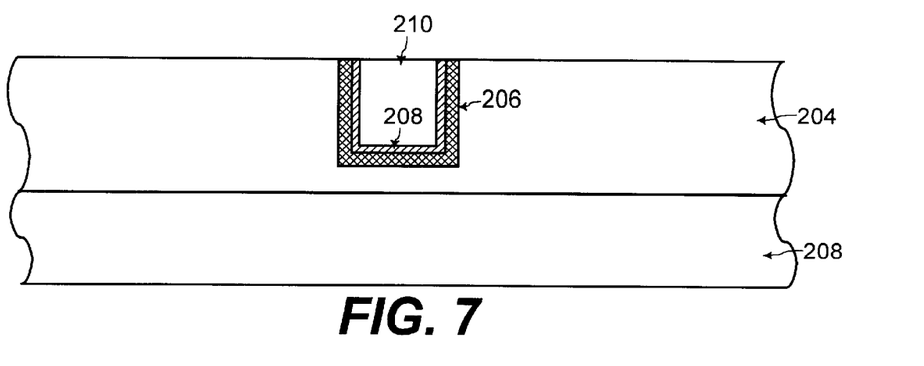
FIG. 7 shows a cross-sectional view of the interconnect structure of FIG. 6 with a CMP (chemical mechanical polishing) process after a thermal anneal process, according to an embodiment of the present invention.

FIGS. 5, 6, and 7 show a cross-sectional view for forming such a test interconnect structure. Referring to FIG. 5, for forming a test interconnect structure, an interconnect opening 202 such as a trench line is formed within an insulating layer 204 on a semiconductor wafer 208. Typically, the semiconductor wafer 208 is comprised of silicon (Si), and the insulating layer 204 is comprised of silicon dioxide (SiO$_2$) or a low dielectric constant insulating material such as organic doped silica, as known to one of ordinary skill in the art of integrated circuit fabrication. Processes for patterning and etching the insulating layer 204 to form such an interconnect opening 202 for the test interconnect structure are known to one of ordinary skill in the art of integrated circuit fabrication.

Copper interconnect is desirable for metallization within an integrated circuit with scaled down dimensions because copper has lower bulk resistivity and potentially higher electromigration tolerance than aluminum. However, because copper is not a volatile metal, copper cannot be easily etched away in a deposition and etching process as typically used for aluminum metallization. Thus, copper interconnect is typically formed by etching the interconnect opening 202 within the insulating layer 204 and then filling the interconnect opening 202 with copper fill.

Referring to FIG. 6, a diffusion barrier material 206 is deposited on the exposed surfaces of the insulating layer 204 including the sidewalls and the bottom wall of the interconnect opening 202. The diffusion barrier material 206 prevents diffusion of copper to be filled within the interconnect opening 202 into the surrounding insulating layer 204. The diffusion barrier material 206 may be a diffusion barrier metal or a diffusion barrier dielectric. Such diffusion barrier materials and processes for deposition of such diffusion barrier materials are known to one of ordinary skill in the art of integrated circuit fabrication.

Copper may easily diffuse into the insulating layer 204, and this diffusion of copper may degrade the performance of the integrated circuit. Thus, the diffusion barrier material 206 is deposited to surround the copper to be filled within the interconnect opening 202. The diffusion barrier material 206 prevents diffusion of copper to be filled within the interconnect opening 202 to the insulating layer 204 to preserve the integrity of the insulating layer 204.

However, the present invention may be practiced with or without deposition of such a diffusion barrier material 206. For example, in future interconnect technology, the surrounding insulating layer 204 may be comprised of a material that is impervious to copper diffusion such that a diffusion barrier material 206 is no longer used to prevent diffusion of copper into the surrounding insulating layer 204.

Further referring to FIG. 6, an alloy seed layer 208 is deposited on the exposed surfaces of the diffusion barrier material 206 including on the sidewalls and the bottom wall of the interconnect opening 202. The alloy seed layer 208 is comprised of a copper alloy with an alloy dopant comprised of one of tin (Sn), zirconium (Zr), or indium (In) having an alloy dopant concentration within a bulk conductive material of copper. Processes, such as PVD (plasma vapor deposition) processes, for deposition of such an alloy seed layer 208 are known to one of ordinary skill in the art of integrated circuit fabrication.

Further referring to FIG. 6, a fill conductive material 210 is formed to fill the interconnect opening 202. For example, the fill conductive material 210 is comprised of substantially pure copper plated from the alloy seed layer 208 in a ECD (electro-chemical deposition) process. Processes, such as ECD (electro-chemical deposition) processes, for forming the fill conductive material 210 to fill the interconnect opening 202 are known to one of ordinary skill in the art of integrated circuit fabrication.

Additionally referring to FIG. 6, after forming the fill conductive material 210 to fill interconnect opening 202, a thermal anneal process at a thermal anneal temperature is performed to heat up the alloy seed layer 206 and the fill conductive material 210. Thermal anneal processes are known to one of ordinary skill in the art of integrated circuit fabrication.

Referring to FIG. 7, after the thermal anneal process is performed to heat up the alloy seed layer 206 and the fill conductive material 210, a CMP (chemical mechanical polishing) process is performed to polish away the fill conductive material 210, the alloy seed layer 208, and the diffusion barrier material 206 on the surrounding insulating layer 204. With such a CMP process, the fill conductive material 210, the alloy seed layer 208, and the diffusion barrier material 206 are contained within the interconnect opening to form a test interconnect structure. CMP (chemical mechanical polishing) processes are known to one of ordinary skill in the art of integrated circuit fabrication.

Figure 8:
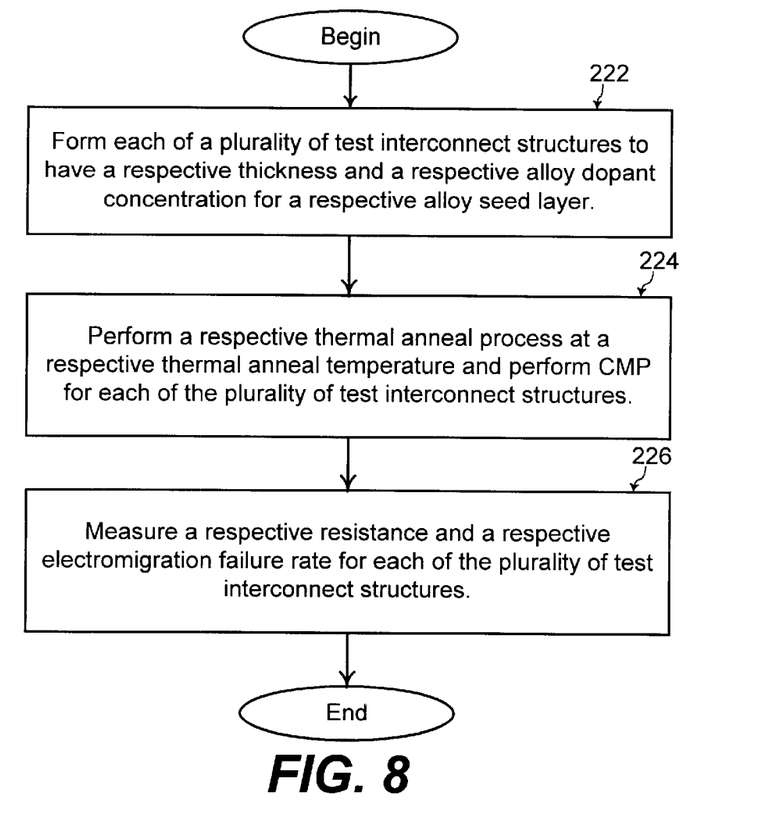
FIG. 8 shows a flowchart of steps for forming a plurality of test interconnect structures with variation of thickness and concentration of alloy dopant of the alloy seed layer and with variation of the thermal anneal temperature for the test interconnect structures, according to an embodiment of the present invention.

FIG. 8 illustrates a flowchart of steps for using a plurality of such test interconnect structures according to an embodiment of the present invention. Referring to FIG. 8, a plurality of such test interconnect structures are fabricated as illustrated in FIGS. 5, 6, and 7. Each test interconnect structure of the plurality of test interconnect structures has a respective alloy seed layer (similar to the alloy seed layer 208 of FIG. 6) with a respective thickness and a respective alloy dopant concentration (step 222 of FIG. 8).

The respective thickness and the respective alloy dopant concentration determines the total number of alloy dopant atoms deposited for the entire test interconnect structure. For example, for a same thickness of the alloy seed layer 208, a higher alloy dopant concentration results in a higher total number of alloy dopant atoms for the entire test interconnect structure. Alternatively, for the same alloy dopant concentration of the alloy seed layer 208, a higher thickness of the alloy seed layer 208 results in a higher total number of alloy dopant atoms for the entire test interconnect structure. The thickness of the alloy seed layer 208 is in a range of from about 200 angstroms to about 1,200 angstroms according to one embodiment of the present invention. Examples of the alloy dopant for the alloy seed layer 208 include tin, zirconium, and indium forming a copper alloy seed layer 208.

Referring to FIGS. 6, 7, and 8, a plurality of test interconnect structures are formed with each test interconnect structure having a respective total number of alloy dopant atoms for the entire test interconnect structure as determined by a respective thickness or a respective alloy dopant concentration of the respective alloy seed layer formed for the test interconnect structure (step 222 of FIG. 8). Referring to FIG. 6, after formation of the respective alloy seed layer for each of the plurality of test interconnect structures, a fill conductive material is formed to fill the interconnect opening of each of the plurality of test interconnect structures.

Further referring to FIG. 8, after formation of the respective alloy seed layer and the fill conductive material for each of the plurality of test interconnect structures, a respective thermal anneal process is performed at a respective thermal anneal temperature for each of the test interconnect structures (step 224 of FIG. 8). The thermal anneal process may be performed with the interconnect structure placed within a forming gas environment including a mixture of nitrogen and hydrogen gas (N$_2$ and H$_2$ gas) according to one embodiment of the present invention. Performing thermal anneal processes in forming gas environments are known to one of ordinary skill in the art of integrated circuit fabrication.

In the prior art, when a pure copper seed layer is used, typical thermal anneal temperatures are in a range of from about 150° Celsius to about 250° Celsius. Because of the relatively high mobility of pure copper, a relatively lower thermal anneal temperature of less than 250° Celsius is used to prevent formation of voids within the pure copper interconnect structure.

In accordance with an aspect of the present invention, with use of the alloy seed layer, the resistances of the test interconnect structures from using relatively higher thermal anneal temperatures are determined. In contrast to the prior art thermal anneal temperature of less than 250° Celsius for pure copper seed layers, higher thermal anneal temperatures equal to or higher than about 250° Celsius, such as in a range of from about 250° Celsius to about 450° Celsius for example, are used for the test interconnect structures having the alloy seed layer. A respective thermal anneal process using a respective thermal anneal temperature is performed for each of the test interconnect structures (step 224 of FIG. 8). Referring to FIGS. 7 and 8, after the respective thermal anneal process, a CMP (chemical mechanical polishing) process is performed for each of the plurality of test interconnect structures (step 224 of FIG. 8) such that the diffusion barrier material 206, the alloy seed layer 208, and the fill conductive material 210 are contained within the interconnect opening.

Further referring to FIGS. 7 and 8, after formation of such a plurality of test interconnect structures, a respective resistance and a respective rate of electromigration failure are measured for each of the plurality of test interconnect structures. According to one embodiment of the present invention, one of the plurality of test interconnect structures is formed with a pure copper seed layer instead of the alloy seed layer 208 and is annealed at a thermal anneal temperature of about 250° Celsius.

Referring to FIGS. 6 and 7, each of the plurality of test interconnect structures are formed as metal lines within a trench opening 202 according to one embodiment of the present invention. The respective resistance of the metal line for each test interconnect structure is measured. Mechanisms for measuring the resistance of a metal line such as by measuring the current and voltage across the metal line for example are known to one of ordinary skill in the art of integrated circuit fabrication.

Figure 9:
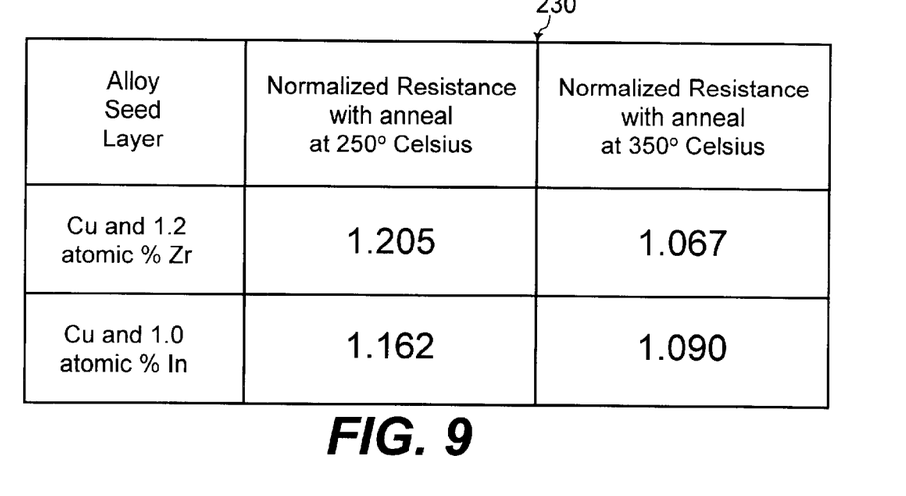
FIG. 9 shows a table of the normalized resistance of the test interconnect structures for a plurality of thermal anneal temperatures.

Referring to FIG. 9, a table 230 lists the normalized resistance for a plurality of test interconnect structures. A resistance (hereafter referred to as a "pure copper interconnect resistance") is measured for the one test interconnect structure formed with a pure copper seed layer instead of the alloy seed layer 208 and with a thermal anneal temperature of about 250° Celsius. In the table 230 of FIG. 9, a normalized resistance of a test interconnect structure is the ratio of the respective resistance of the test interconnect structure over the pure copper interconnect resistance when the dimensions of the test interconnect structure and of the pure copper interconnect structure are substantially the same.

Referring to the table 230 of FIG. 9, a first test interconnect structure is formed with an alloy seed layer having a thickness of about 500 angstroms and comprised of 1.2 atomic percent zirconium in copper as the bulk conductive material. Any thickness of the alloy seed layer 208 mentioned herein refers to the nominal thickness of the alloy seed layer deposited on the field region (i.e., on the top surface of the surrounding insulating layer 204) surrounding the interconnect opening 202. The actual thickness of the alloy seed layer 208 deposited on the sidewalls and the bottom wall of the interconnect opening 202 is typically lower than the nominal thickness of the alloy seed layer deposited on the field region. The thickness of the alloy seed layer 208 deposited on the sidewalls of the interconnect opening 202 is typically lower than the thickness of the alloy seed layer 208 deposited on the bottom wall of the interconnect opening 202. In addition, the thickness of the alloy seed layer 208 deposited on the walls of the interconnect opening 202 is typically lower for the interconnect opening 202 having a higher aspect ratio. The thickness of the alloy seed layer 208 deposited on the walls of the interconnect opening 202 is typically in a range of from about 10% to about 80% of the nominal thickness of the alloy seed layer deposited on the field region, depending on the aspect ratio of the interconnect opening 202 and on the location of each of the walls of the interconnect opening 202, as known to one of ordinary skill in the art of integrated circuit fabrication.

When the first test interconnect structure is annealed with a thermal anneal temperature of about 250° Celsius, the first test interconnect structure has a normalized resistance of 1.205. Further referring to the table 230 of FIG. 9, a second test interconnect structure having a thickness of about 500 angstroms is also formed with an alloy seed layer comprised of 1.2 atomic percent zirconium in copper as the bulk conductive material. When the second test interconnect structure is annealed with a thermal anneal temperature of about 350° Celsius, the second test interconnect structure has a normalized resistance of 1.067.

In addition, referring to the table 230 of FIG. 9, a third test interconnect structure having a thickness of about 500 angstroms is formed with an alloy seed layer comprised of 1.0 atomic percent indium in copper as the bulk conductive material. When the third test interconnect structure is annealed with a thermal anneal temperature of about 250° Celsius, the third test interconnect structure has a normalized resistance of 1.162. Further referring to the table 230 of FIG. 9, a fourth test interconnect structure having a thickness of about 500 angstroms is also formed with an alloy seed layer comprised of 1.0 atomic percent indium in copper as the bulk conductive material. When the fourth test interconnect structure is annealed with a thermal anneal temperature of about 350° Celsius, the fourth test interconnect structure has a normalized resistance of 1.090. The respective resistance measured for each of the first, second, third, and fourth test interconnect structures of the table 230 of FIG. 9 indicates that the higher thermal anneal temperature of 350° Celsius may significantly minimize the resistance (by as much as about 15%) of the interconnect structure formed with an alloy seed layer.

For the data of the table 230 of FIG. 9, the alloy seed layer 208 is deposited in a standard PVD (plasma vapor deposition) process using 1 KiloWatt to 4 KiloWatt of DC power, 1 milliTorr to 6 milliTorr pressure, no wafer bias, and a copper alloy target having zirconium concentration of 1.5 atomic percent to deposit the copper alloy seed layer 208 having 1.2 atomic percent zirconium. For the copper alloy seed layer having 1.0 atomic percent indium, similar process parameters of the standard PVD (plasma vapor deposition) process are used with a copper alloy target having indium concentration of 2.0 atomic percent. Standard PVD (plasma vapor deposition) processes for depositing copper alloy material are known to one of ordinary skill in the art of integrated circuit fabrication.

Alternatively, an IPVD (ionized plasma vapor deposition) process may be used for forming the alloy seed layer 208 according to another embodiment of the present invention with 8 KiloWatt to 80 KiloWatt of DC power, 0.5 milliTorr to 20 milliTorr pressure, a wafer bias of from about 0 Watts to about 500 Watts, and a copper alloy target having zirconium concentration of 1.5 atomic percent to deposit the copper alloy seed layer 208 having 1.2 atomic percent zirconium. For the copper alloy seed layer having 1.0 atomic percent indium, similar process parameters of the IPVD (ionized plasma vapor deposition) process are used with a copper alloy target having indium concentration of 2.0 atomic percent.

IPVD (ionized plasma vapor deposition) processes for depositing copper alloy material are known to one of ordinary skill in the art of integrated circuit fabrication. IPVD processes provide better (typically 10–30% better) step coverage than standard PVD processes, as known to one of ordinary skill in the art of integrated circuit fabrication. Thus, the nominal thickness of the alloy seed layer 208 deposited with an IPVD process may be lower than that deposited with the standard PVD process to deposit the same number of the alloy dopant atoms within the interconnect opening 202.

Figure 10:
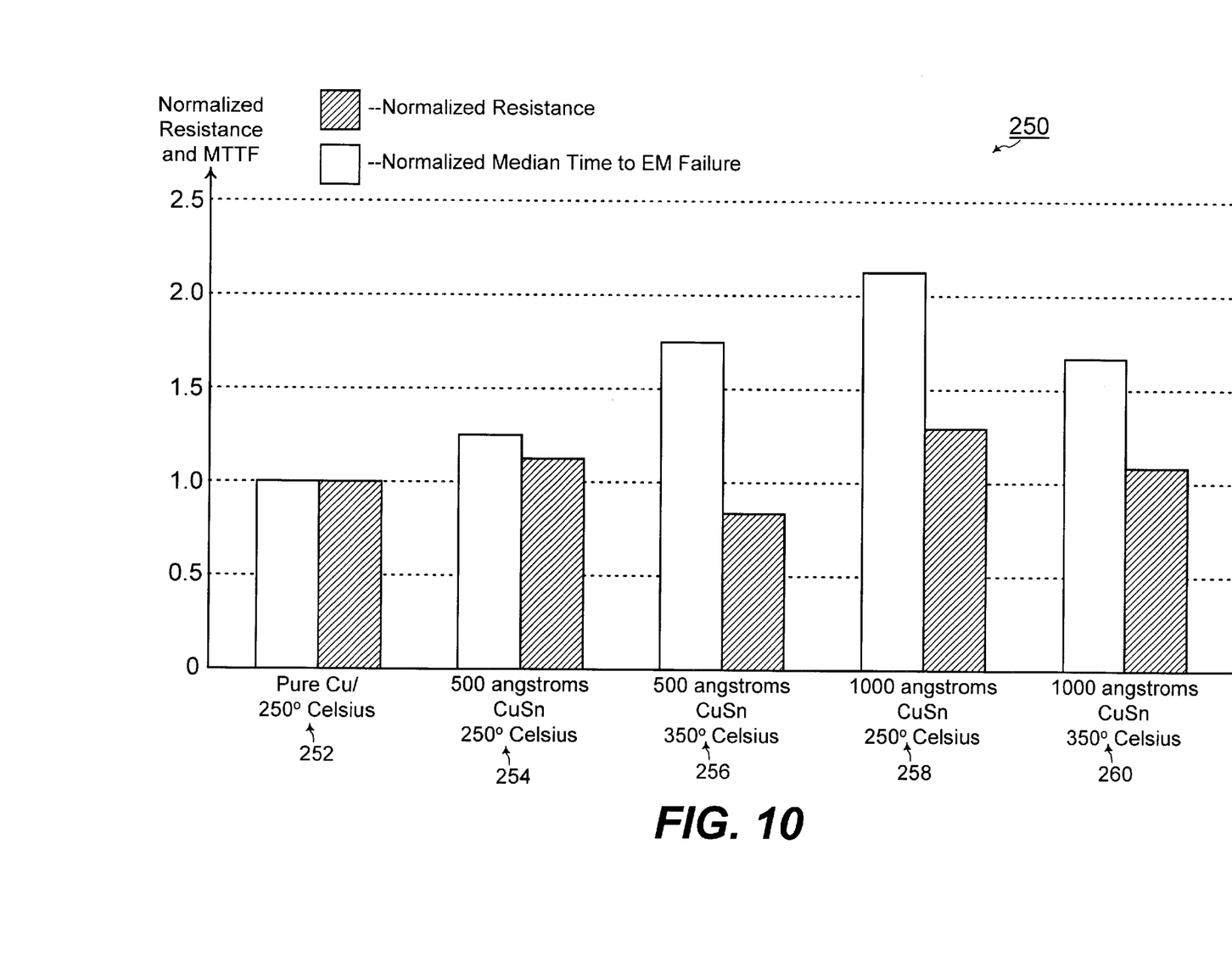
FIG. 10 shows a bar graph of the normalized resistance and the normalized rate of electromigration failure of the test interconnect structures for a plurality of thermal anneal temperatures and a plurality of thicknesses for the alloy seed layer.

In addition to the respective resistance for each of the plurality of test interconnect structures, the respective rate of electromigration failure may also be measured for each of the plurality of test interconnect structures. Referring to FIG. 10, a bar graph 250 shows a respective resistance and a respective median time to electromigration failure measured for each of a plurality of test interconnect structures formed as described in reference to FIGS. 5, 6, and 7. FIG. 10 shows bar graph data for a first test interconnect structure 252 formed with a pure copper seed layer instead of the alloy seed layer 208 and annealed with a thermal anneal temperature of about 250° Celsius for an anneal time of about 30 minutes.

The bar graph 250 of FIG. 10 shows normalized resistance which is the ratio of the measured resistance for a test interconnect structure to the resistance of the first test interconnect structure 252 formed with the pure copper seed layer instead of the alloy seed layer 208 when the dimensions of the test interconnect structure and of the pure copper interconnect structure are substantially the same. Mechanisms for measuring the resistance of a metal line for each test interconnect structure such as by measuring the current and voltage across the metal line for example are known to one of ordinary skill in the art of integrated circuit fabrication.

In addition, the bar graph 250 of FIG. 10 shows normalized median time to electromigration failure which is the ratio of the median time to electromigration failure for a test interconnect structure to the median time to electromigration failure of the first test interconnect structure 252 formed with the pure copper seed layer instead of the alloy seed layer 208. Mechanisms for measuring the median time to electromigration failure of a metal line for each test interconnect structure are known to one of ordinary skill in the art of integrated circuit fabrication. For example, according to one embodiment of the present invention, a test interconnect structure is heated to about 350° Celsius and a current density of 1.5 megaAmps/cm$^2$ is biased to flow through the test interconnect structure. With such operating conditions, a test interconnect structure eventually forms an open-circuit due to electromigration. The median time to such open-circuit electromigration failure is measured as the rate of electromigration failure for the test interconnect structure. A lower median time to electromigration failure means a higher rate of electromigration failure.

Referring to FIG. 10, the normalized resistance of the first test interconnect structure 252 formed with the pure copper seed layer instead of the alloy seed layer 208 is 1, and the normalized median time to electromigration failure of the first test interconnect structure 252 is 1. FIG. 10 also shows bar graph data for a second test interconnect structure 254 formed with an alloy seed layer 208 having a thickness of about 500 angstroms and a concentration of tin of about 0.3 atomic percent in copper as the bulk conductive material. The second test interconnect structure is formed similarly as described in reference to FIGS. 5, 6, and 7. The second test interconnect structure is annealed with a thermal anneal temperature of about 250° Celsius for an anneal time of about 30 minutes. The second test interconnect structure has a normalized resistance of about 1.2, and has a normalized median time to electromigration failure of about 1.1.

Additionally, FIG. 10 shows bar graph data for a third test interconnect structure 256 formed with an alloy seed layer 208 having a thickness of about 500 angstroms and a concentration of tin of about 0.3 atomic percent in copper as the bulk conductive material. The third test interconnect structure is formed similarly as described in reference to FIGS. 5, 6, and 7. The third test interconnect structure is annealed with a thermal anneal temperature of about 350° Celsius for an anneal time of about 30 minutes. The third test interconnect structure has a normalized resistance of about 0.8, and has a normalized median time to electromigration failure of about 1.75.

Furthermore, FIG. 10 shows bar graph data for a fourth test interconnect structure 258 formed with an alloy seed layer 208 having a thickness of about 1000 angstroms and a concentration of tin of about 0.3 atomic percent in copper as the bulk conductive material. The fourth test interconnect structure is formed similarly as described in reference to FIGS. 5, 6, and 7. The fourth test interconnect structure is annealed with a thermal anneal temperature of about 250° Celsius for an anneal time of about 30 minutes. The fourth test interconnect structure has a normalized resistance of about 1.3, and has a normalized median time to electromigration failure of about 2.1.

Also, FIG. 10 shows bar graph data for a fifth test interconnect structure 260 formed with an alloy seed layer 208 having a thickness of about 1000 angstroms and a concentration of tin of about 0.3 atomic percent in copper as the bulk conductive material. The fifth test interconnect structure is formed similarly as described in reference to FIGS. 5, 6, and 7. The fifth test interconnect structure is annealed with a thermal anneal temperature of about 350° Celsius for an anneal time of about 30 minutes. The fifth test interconnect structure has a normalized resistance of about 1.1, and has a normalized median time to electromigration failure of about 1.65.

The data of the measured resistance and the measured rate of electromigration failure for the test interconnect structures is used to form an IC (integrated circuit) interconnect structure during fabrication of integrated circuits. Such data for the test interconnect structures indicates how the IC interconnect structure may be formed for a desired resistance and a desired rate of electromigration failure.

For the data of the FIG. 10, the alloy seed layer 208 is deposited in a standard PVD (plasma vapor deposition) process using 1 KiloWatt to 4 KiloWatt of DC power, 1 milliTorr to 6 milliTorr pressure, no wafer bias, and a copper alloy target having tin concentration of 0.5 atomic percent to deposit the copper alloy seed layer 208 having 0.3 atomic percent tin. Standard PVD (plasma vapor deposition) processes for depositing copper alloy material are known to one of ordinary skill in the art of integrated circuit fabrication.

Alternatively, an IPVD (ionized plasma vapor deposition) process may be used for forming the alloy seed layer 208 according to another embodiment of the present invention with 8 KiloWatt to 80 KiloWatt of DC power, 0.5 milliTorr to 20 milliTorr pressure, a wafer bias of from about 0 Watts to about 500 Watts, and a copper alloy target having tin concentration of 0.5 atomic percent to deposit the copper alloy seed layer 208 having 0.3 atomic percent tin.

IPVD (ionized plasma vapor deposition) processes for depositing copper alloy material are known to one of ordinary skill in the art of integrated circuit fabrication. IPVD processes provide better (typically 10–30% better) step coverage than standard PVD processes, as known to one of ordinary skill in the art of integrated circuit fabrication. Thus, the nominal thickness of the alloy seed layer 208 deposited with an IPVD process may be lower than that deposited with the standard PVD process to deposit the same number of the alloy dopant atoms within the interconnect opening 202.

Figure 11:
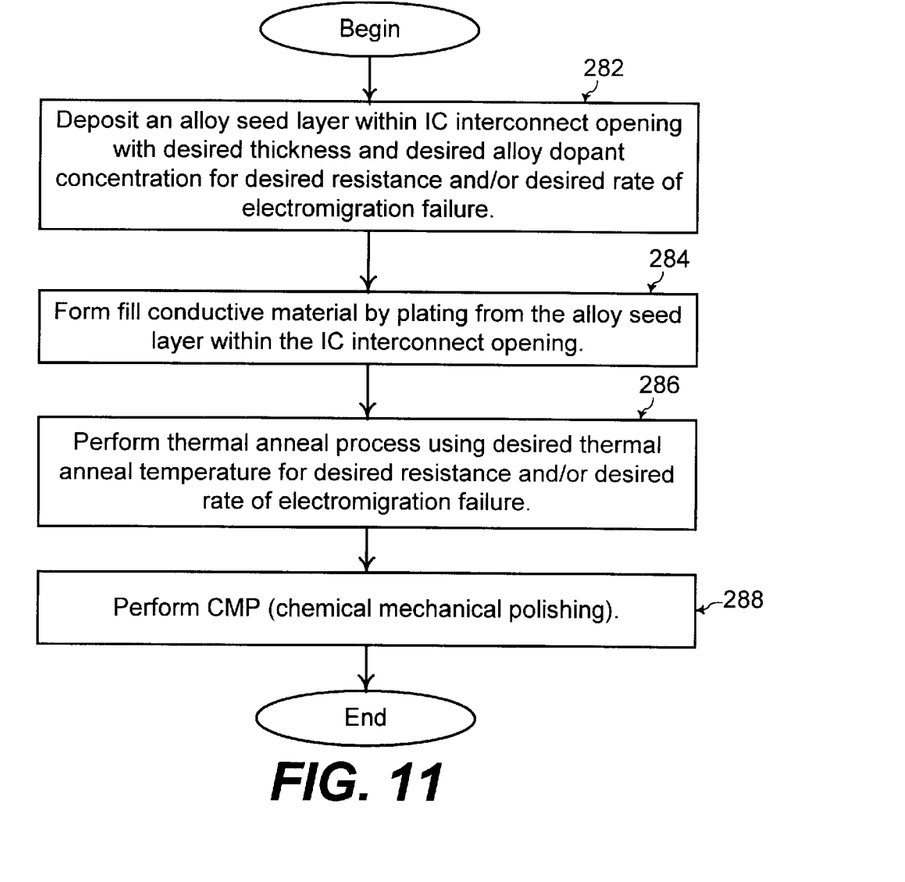
FIG. 11 shows a flowchart of steps for forming an IC interconnect structure with adjustment of the thickness and concentration of alloy dopant of the alloy seed layer and with adjustment of the thermal anneal temperature to minimize resistance and rate of electromigration failure of the IC interconnect structure, according to an embodiment of the present invention.
Figure 12:
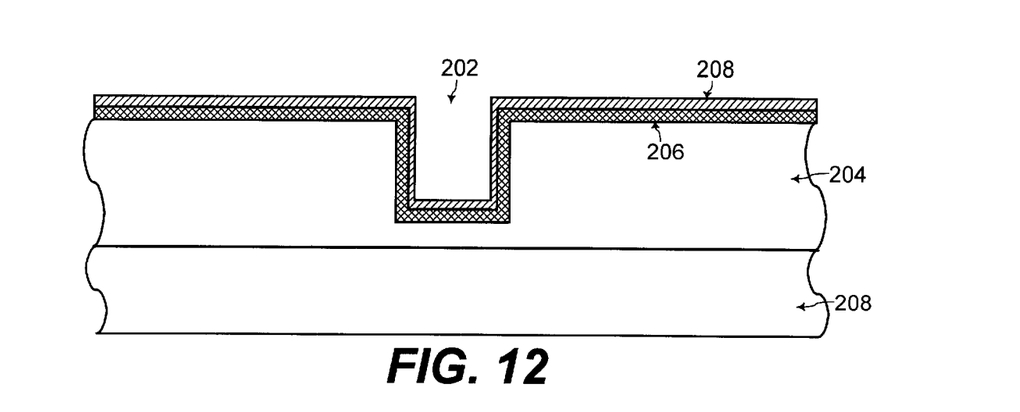
FIGS. 12 and 13 show cross-sectional views of the interconnect structure of FIGS. 5, 6, and 7 with an additional seed enhancement layer, according to another embodiment of the present invention.

FIG. 11 shows a flowchart of steps for forming such an IC interconnect structure, and the IC interconnect structure is formed similarly as described in reference to FIGS. 5, 6, and 7. For the IC interconnect structure, an alloy seed layer is deposited within an IC interconnect opening with a desired thickness and a desired alloy dopant concentration within a bulk conductive material (step 282 of FIG. 11). Fill conductive material is formed to fill the IC interconnect opening by plating the fill conductive material from the alloy seed layer within the IC interconnect opening (step 284 of FIG. 11). A thermal anneal process using a desired thermal anneal temperature is performed for the IC interconnect structure (step 286 of FIG. 11). A CMP (chemical mechanical polishing) process is performed after the thermal anneal process for the IC interconnect structure (step 288 of FIG. 11).

For the IC interconnect structure, the thickness and the alloy dopant concentration of the alloy seed layer and the thermal anneal temperature are adjusted to attain a desired resistance and a desired rate of electromigration failure for the IC interconnect structure, as indicated by the measured resistances and the measured rates of electromigration failure for the test interconnect structures. The desired thickness and the desired alloy dopant concentration of the alloy seed layer and the desired thermal anneal temperature for the IC interconnect structure depend on the respective thickness and the respective alloy dopant concentration of the alloy seed layer and the respective thermal anneal temperature of one of the plurality of test interconnect structures having the respective measured resistance that is closest to the desired resistance for the IC interconnect structure and/or having the respective measured rate of electromigration failure that is closest to the desired rate of electromigration failure for the IC interconnect structure.

In one embodiment of the present invention, the resistance and the rate of electromigration failure are minimized for the IC interconnect structure. For example, referring to the bar graph 250 of FIG. 10, the bar graph data for the third test interconnect structure 256 has the lowest normalized resistance of about 0.8 and a relatively high normalized median time to electromigration failure of about 1.75. For forming an IC interconnect structure having such similar resistance and rate of electromigration failure, the IC interconnect structure is formed with an alloy seed layer having a thickness of about 500 angstroms and a concentration of tin of about 0.3 atomic percent in copper as the bulk conductive material, similar to the third test interconnect structure of FIG. 10. The IC interconnect structure is annealed with a thermal anneal temperature of about 350° Celsius for an anneal time of about 30 minutes, similar to the third test interconnect structure of FIG. 10.

In this manner, test interconnect structures are formed with varying thicknesses and alloy dopant concentrations of the alloy seed layer and with varying thermal anneal temperatures. The resistances and rates of electromigration failure of such test interconnect structures are measured such that an IC interconnect structure may be formed with minimized resistance and electromigration failure according to the data of the resistances and rates of electromigration failure of such test interconnect structures. In contrast to the present invention, in the prior art, the effect of the alloy seed layer increasing the resistance of the interconnect structure is ignored because the volume of the alloy seed layer is assumed to be a negligible fraction of the entire interconnect structure.

Rather, as indicated by the bar graph of FIG. 10, varying the parameters of the thickness and alloy dopant concentration of the alloy seed layer and the thermal anneal temperature may significantly, and even unexpectedly, affect the resistance and the rate of electromigration failure of the interconnect structure. For example, using an alloy seed layer instead of a pure copper seed layer is conventionally expected to increase the resistance of an interconnect structure. However, referring to FIG. 10, the bar graph data for the third test interconnect structure 256 unexpectedly shows a resistance for the third test interconnect structure using an alloy seed layer that is lower than the resistance for the first test interconnect structure 252 using a pure copper seed layer.

In a thermal anneal process, the alloy dopant from the alloy seed layer diffuses out of the alloy seed layer and into the entire interconnect structure. In addition, the alloy dopant from the alloy seed layer may diffuse out of the interconnect structure and form on the top surface of the fill conductive material 210. When the top portion of the fill conductive material 210 is polished away, the alloy dopant is removed from the interconnect structure. A lower amount of alloy dopant remaining within the interconnect structure may result in a higher rate of electromigration failure.

A higher thermal anneal temperature may result in a higher amount of alloy dopant diffusing out of the interconnect structure. Thus, a lower thermal anneal temperature is conventionally expected to result in a higher reduction of the rate of electromigration failure. However, referring to FIG. 10, the bar graph data for the second test interconnect structure 254 and the third test interconnect structure 256 unexpectedly shows a lower rate of electromigration failure (i.e. a higher median time to electromigration failure) for the third test interconnect structure 256 annealed at a higher thermal anneal temperature than the second test interconnect structure 254. In this manner, using such test interconnect structures may significantly reduce resistance of IC interconnect structures to enhance the speed performance of integrated circuits. In addition, using such test interconnect structures may significantly reduce rate of electromigration failure to enhance the reliability of integrated circuits.

The foregoing is by way of example only and is not intended to be limiting. For example, the present invention is described for formation of copper interconnect. However, the present invention may be practiced for minimizing resistance and electromigration failure with conductive fill of other types of interconnects, as would be apparent to one of ordinary skill in the art of integrated circuit fabrication from the description herein. In addition, formation of a metal line within a trench opening is illustrated. However, the present invention may be practiced with other types of interconnect openings such as openings for a via hole or a dual damascene interconnect structure, as would be apparent to one of ordinary skill in the art of integrated circuit fabrication from the description herein.

In addition, the data of the resistances and the rates of electromigration failure for the test interconnect structures may be used for adjusting just the resistance or just the rate of electromigration failure of the IC interconnect structure. Alternatively, the data of the resistances and the rates of electromigration failure for the test interconnect structures may be used for adjusting both the resistance and the rate of electromigration failure of the IC interconnect structure.

Additional process steps may be used with the practice of the present invention. For example referring to FIG. 12, the thickness of the alloy seed layer 208 at the sidewalls and the bottom wall of the interconnect opening 202 is thinner than the nominal thickness of the alloy seed layer 208 at the field regions on the top surface of the surrounding insulating layer 204. For the interconnect opening 202 having high aspect ratio, the alloy seed layer 208 at the sidewalls and the bottom wall of the interconnect opening 202 may be too thin for plating the fill conductive material 210 from the alloy seed layer 208 alone. In a typical ECD (electrochemical deposition) process for plating the fill conductive material 210, a particular range of resistance of the seed layer within the interconnect opening 202 may be desired, as known to one of ordinary skill in the art of integrated circuit fabrication.

Figure 13:
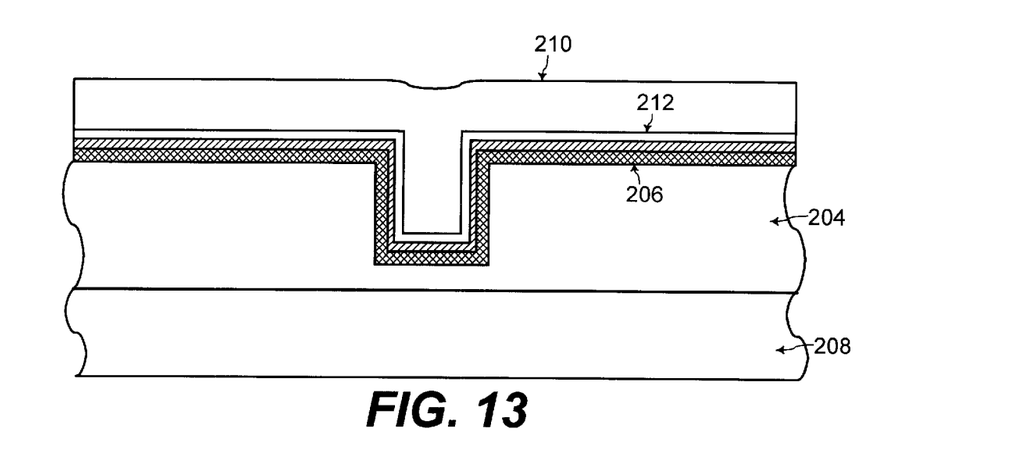

In that case, referring to FIG. 13, a seed enhancement layer 212 comprised of the bulk conductive material of the alloy seed layer 208 is further deposited after the alloy seed layer 208 before plating the fill conductive material 210. For example, when the alloy seed layer 208 is comprised of a copper alloy, the seed enhancement layer 212 is comprised of substantially pure copper. Processes, such as PVD (plasma vapor deposition) processes or ECD (electrochemical deposition) processes for depositing the seed enhancement layer 212 are known to one of ordinary skill in the art of integrated circuit fabrication. The fill conductive material 210 is then plated from the alloy seed layer 208 and the seed enhancement layer 212.

Furthermore, as will be understood by those skilled in the art, the structures described herein may be made or used in the same way regardless of their position and orientation. Accordingly, it is to be understood that terms and phrases such as "in," "bottom," and "side" as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:
1. A method for forming an IC (integrated circuit) interconnect structure by filling an IC (integrated circuit) interconnect opening within an insulating layer on a semiconductor wafer, the method including the steps of:
   A. forming a plurality of test interconnect structures with each test interconnect structure having a respective test alloy seed layer deposited onto sidewalls and a bottom wall of a respective test interconnect opening within an insulating layer and with a test fill conductive material formed to fill said respective test interconnect opening; wherein said respective test alloy seed layer of each of said test interconnect structures has a respective test thickness and a respective test concentration of a test alloy dopant within a test bulk conductive material;
   B. performing a respective test thermal anneal process at a respective test thermal anneal temperature for each of said plurality of test interconnect structures;
   C. measuring a respective test resistance of each of said plurality of test interconnect structures;
   D. forming said IC interconnect structure by depositing an alloy seed layer onto sidewalls and a bottom wall of said IC interconnect opening, said alloy seed layer within said IC interconnect opening being comprised of a bulk conductive material that is substantially same as said test bulk conductive material doped with an alloy dopant that is substantially same as said test alloy dopant, wherein said alloy seed layer has a desired thickness that is determined by the respective test thickness of the respective test alloy seed layer of one of the test interconnect structures having a respective test resistance that is closest to a desired resistance for said IC interconnect structure, and wherein said alloy seed layer has a concentration of said alloy dopant that is determined by the respective test concentration of the test alloy dopant of the respective test alloy seed layer of one of the test interconnect structures having a respective test resistance that is closest to said desired resistance for said IC interconnect structure;
   E. filling said IC interconnect opening with a fill conductive material that is substantially same as said test fill conductive material by growing said fill conductive material from said alloy seed layer for forming said IC interconnect structure within said IC interconnect opening; and
   F. performing a thermal anneal process at a thermal anneal temperature to anneal said alloy seed layer and said fill conductive material within said IC interconnect opening, wherein said thermal anneal temperature is determined by the respective test thermal anneal temperature of one of the test interconnect structures having a respective test resistance that is closest to said desired resistance for said IC interconnect structure.

2. The method of claim 1, further including the step of:
depositing a diffusion barrier material on said sidewalls and said bottom wall of said IC interconnect opening before said step D, wherein said diffusion barrier material prevents diffusion of said fill conductive material into said insulating layer surrounding said IC interconnect opening.

3. The method of claim 1, further including the step of:
performing a respective test CMP (chemical mechanical polishing) process for each of said plurality of test interconnect structures after said step B and before said step C.

4. The method of claim 1, further including the step of:
performing a CMP (chemical mechanical polishing) process for said IC interconnect structure after said step F.

5. The method of claim 1, wherein said fill conductive material for said IC interconnect structure is comprised of copper, said bulk conductive material of said alloy seed layer for said IC interconnect structure is comprised of copper, and said alloy dopant for said IC interconnect structure is comprised of tin (Sn).

6. The method of claim 5, wherein said respective test concentration of said test alloy dopant for each of said plurality of test interconnect structures and said concentration of said alloy dopant for said IC interconnect structure are each about 0.3 atomic percent.

7. The method of claim 6, wherein said thickness of said alloy seed layer for said IC interconnect structure is in a range of from about 200 angstroms to about 1,200 angstroms.

8. The method of claim 7, wherein said thermal anneal temperature for said IC interconnect structure is in a range of from about 250° Celsius to about 450° Celsius.

9. The method of claim 1, wherein said thermal anneal temperature for said IC interconnect structure is in a range of from about 250° Celsius to about 450° Celsius.

10. The method of claim 1, wherein said alloy dopant of said alloy seed layer for said IC interconnect structure is comprised of at least one of tin, zirconium, and indium.

11. The method of claim 1, wherein said alloy seed layer for said IC interconnect structure has said desired thickness that is determined by the respective test thickness of the respective test alloy seed layer of one of the test interconnect structures having a respective test resistance that is lowest of said respective test resistances of said test interconnect structures, and wherein said alloy seed layer for said IC interconnect structure has a concentration of said alloy dopant that is determined by the respective test concentration of the test alloy dopant of the respective test alloy seed layer of one of the test interconnect structures having a respective test resistance that is lowest of said respective test resistances of said test interconnect structures, and wherein said thermal anneal temperature for said IC interconnect structure is determined by the respective test thermal anneal temperature of one of the test interconnect structures having a respective test resistance that is lowest of said respective test resistances of said test interconnect structures.

12. The method of claim 1, further including the step of:
measuring a respective test electromigration failure rate of each of said plurality of test interconnect structures;
wherein said alloy seed layer for said IC interconnect structure has a desired thickness that is determined by the respective test thickness of the respective test alloy seed layer of one of the test interconnect structures having a respective test electromigration failure rate that is closest to a desired electromigration failure rate for said IC interconnect structure, and wherein said alloy seed layer for said IC interconnect structure has a concentration of said alloy dopant that is determined by the respective test concentration of the test alloy dopant of the respective test alloy seed layer of one of the test interconnect structures having a respective test electromigration failure rate that is closest to said desired electromigration failure rate for said IC interconnect structure, and wherein said thermal anneal temperature for said IC interconnect structure is determined by the respective test thermal anneal temperature of one of the test interconnect structures having a respective electromigration failure rate that is closest to said desired electromigration failure rate for said IC interconnect structure.

13. The method of claim 12, wherein said fill conductive material for said IC interconnect structure is comprised of copper, said bulk conductive material of said alloy seed layer for said IC interconnect structure is comprised of copper, and said alloy dopant for said IC interconnect structure is comprised of tin (Sn) having a concentration of about 0.3 atomic percent, wherein said thickness of said alloy seed layer for said IC interconnect structure is about 500 angstroms, and wherein said thermal anneal temperature for said IC interconnect structure is about 350° Celsius.

14. The method of claim 1, further including the step of:
depositing a seed enhancement layer comprised of said bulk conductive material onto said alloy seed layer for said IC interconnect structure, after said step D and before said step E;
wherein said fill conductive material is plated from said seed enhancement layer and said alloy seed layer during said step E.

15. A method for forming an IC (integrated circuit) interconnect structure by filling an IC (integrated circuit) interconnect opening within an insulating layer on a semiconductor wafer, the method including the steps of:

A. forming a plurality of test interconnect structures with each test interconnect structure having a respective test alloy seed layer deposited onto sidewalls and a bottom wall of a respective test interconnect opening within an insulating layer and with a test fill conductive material formed to fill said respective test interconnect opening;
wherein said respective test alloy seed layer of each of said test interconnect structures has a respective test thickness and a respective test concentration of a test alloy dopant within a test bulk conductive material;

B. performing a respective test thermal anneal process at a respective test thermal anneal temperature for each of said plurality of test interconnect structures;

C. measuring a respective test electromigration failure rate of each of said plurality of test interconnect structures;

D. forming said IC interconnect structure by depositing an alloy seed layer onto sidewalls and a bottom wall of said IC interconnect opening, said alloy seed layer within said IC interconnect opening being comprised of a bulk conductive material that is substantially same as said test bulk conductive material doped with an alloy dopant that is substantially same as said test alloy dopant;

E. filling said IC interconnect opening with a fill conductive material that is substantially same as said test fill conductive material by growing said fill conductive material from said alloy seed layer within said IC interconnect opening to form said IC interconnect structure, wherein said alloy seed layer for said IC interconnect structure has a desired thickness that is determined by the respective test thickness of the respective test alloy seed layer of one of the test interconnect structures having a respective test electromigration failure rate that is closest to a desired electromigration failure rate for said IC interconnect structure, and wherein said alloy seed layer for said IC interconnect structure has a concentration of said alloy dopant that is determined by the respective test concentration of the test alloy dopant of the respective test alloy seed layer of one of the test interconnect structures having a respective test electromigration failure rate that is closest to said desired electromigration failure rate for said IC interconnect structure; and F. performing a thermal anneal process at a thermal anneal temperature to anneal said alloy seed layer and said fill conductive material within said IC interconnect opening, wherein said thermal anneal temperature is determined by the respective test thermal anneal temperature of one of the test interconnect structures having a respective electromigration failure rate that is closest to said desired electromigration failure rate for said IC interconnect structure.

16. The method of claim 15, further including the step of:
depositing a diffusion barrier material on said sidewalls and said bottom wall of said IC interconnect opening before said step D, wherein said diffusion barrier material prevents diffusion of said fill conductive material into said insulating layer surrounding said IC interconnect opening.

17. The method of claim 15, further including the step of:
performing a respective test CMP (chemical mechanical polishing) process for each of said plurality of test interconnect structures after said step B and before said step C.

18. The method of claim 15, further including the step of:
performing a CMP (chemical mechanical polishing) process for said IC interconnect structure after said step F.

19. The method of claim 15, wherein said fill conductive material for said IC interconnect structure is comprised of copper, said bulk conductive material of said alloy seed layer for said IC interconnect structure is comprised of copper, and said alloy dopant for said IC interconnect structure is comprised of tin (Sn).

20. The method of claim 19, wherein said respective test concentration of said test alloy dopant for each of said plurality of test interconnect structures and said concentration of said alloy dopant for said IC interconnect structure are each about 0.3 atomic percent.

21. The method of claim 20, wherein said thickness of said alloy seed layer for said IC interconnect structure is in a range of from about 200 angstroms to about 1,200 angstroms.

22. The method of claim 21, wherein said thermal anneal temperature for said IC interconnect structure is in a range of from about 250° Celsius to about 450° Celsius.

23. The method of claim 15, wherein said thermal anneal temperature for said IC interconnect structure is in a range of from about 250° Celsius to about 450° Celsius.

24. The method of claim 15, wherein said alloy dopant of said alloy seed layer for said IC interconnect structure is comprised of at least one of tin, zirconium, and indium.

25. The method of claim 15, wherein said alloy seed layer for said IC interconnect structure has a desired thickness that is determined by the respective test thickness of the respective test alloy seed layer of one of the test interconnect structures having a respective test electromigration failure rate that is lowest of the respective test electromigration failure rates of said test interconnect structures, and wherein said alloy seed layer for said IC interconnect structure has a concentration of said alloy dopant that is determined by the respective test concentration of the test alloy dopant of the respective test alloy seed layer of one of the test interconnect structures having a respective test electromigration failure rate that is lowest of the respective test electromigration failure rates of said test interconnect structures, and wherein said thermal anneal temperature for said IC interconnect structure is determined by the respective test thermal anneal temperature of one of the test interconnect structures having a respective electromigration failure rate that is lowest of the respective test electromigration failure rates of said test interconnect structures.

26. The method of claim 15, further including the step of:
measuring a respective resistance of each of said plurality of test interconnect structures, wherein said alloy seed layer for said IC interconnect structure has a desired thickness that is determined by the respective test thickness of the respective test alloy seed layer of one of the test interconnect structures having a respective test resistance that is closest to a desired resistance for said IC interconnect structure, and wherein said alloy seed layer for said IC interconnect structure has a concentration of said alloy dopant that is determined by the respective test concentration of the test alloy dopant of the respective test alloy seed layer of one of the test interconnect structures having a respective test resistance that is closest to said desired resistance for said IC interconnect structure, and wherein said thermal anneal temperature for said IC interconnect structure is determined by the respective test thermal anneal temperature of one of the test interconnect structures having a respective test resistance that is closest to said desired resistance for said IC interconnect structure.

27. The method of claim 26, wherein said fill conductive material for said IC interconnect structure is comprised of copper, said bulk conductive material of said alloy seed layer for said IC interconnect structure is comprised of copper, and said alloy dopant for said IC interconnect structure is comprised of tin (Sn) having a concentration of about 0.3 atomic percent, wherein said thickness of said alloy seed layer for said IC interconnect structure is about 500 angstroms, and wherein said thermal anneal temperature for said IC interconnect structure is about 350° Celsius.

28. The method of claim 15, further including the step of:
depositing a seed enhancement layer comprised of said bulk conductive material onto said alloy seed layer for said IC interconnect structure, after said step D and before said step E;
wherein said fill conductive material is plated from said seed enhancement layer and said alloy seed layer for said IC interconnect structure during said step E.

* * * * *